United States Patent [19]
Doll et al.

[11] Patent Number: 5,264,296
[45] Date of Patent: Nov. 23, 1993

[54] LASER DEPOSITON OF CRYSTALLINE BORON NITRIDE FILMS

[75] Inventors: Gary L. Doll, Utica; Jeffrey A. Sell, West Bloomfield; Charles A. Peck, Royal Oak, all of Mich.

[73] Assignee: General Motors Corporation, Detroit, Mich.

[21] Appl. No.: 523,951

[22] Filed: May 16, 1990

Related U.S. Application Data

[62] Division of Ser. No. 446,758, Dec. 6, 1989, abandoned.

[51] Int. Cl.$^5$ ............................................. C23C 14/06
[52] U.S. Cl. ................................... 428/698; 428/446; 428/457; 428/704
[58] Field of Search ................. 428/704, 698, 446, 457

[56] References Cited

U.S. PATENT DOCUMENTS

| | | | |
|---|---|---|---|
| 4,118,539 | 10/1978 | Hirai et al. | 156/614 |
| 4,297,387 | 10/1981 | Beale | 427/42 |
| 4,565,741 | 1/1986 | Morimoto et al. | 428/698 |
| 4,714,625 | 12/1987 | Chopra et al. | 427/47 |
| 4,832,986 | 5/1989 | Gladfelter et al. | 427/255 |
| 4,843,031 | 6/1989 | Banh et al. | 437/935 |
| 4,957,773 | 9/1990 | Spencer et al. | 427/255.2 |
| 4,973,494 | 11/1990 | Yamazaki | 427/255.2 |
| 4,980,730 | 12/1990 | Mishima et al. | 357/61 |

FOREIGN PATENT DOCUMENTS

| | | | |
|---|---|---|---|
| 61-222111 | 2/1986 | Japan . | |
| 61-84379 | 4/1986 | Japan | 427/53.1 |
| 62-77454 | 4/1987 | Japan . | |
| 243770 | 10/1987 | Japan . | |

OTHER PUBLICATIONS

Doll et al "Laser Deposited Cubic Boron Nitride Films" MRS Spring Meeting Apr. 1990 San Francisco Calif.

Doll et al "Laser Deposited Cubic Boron Nitride Films on Silicon" 2nd Int. Conf. on the New Diamond Sci & Tech, Sep. 23-27, 1990 D.C.

Doll et al "The Growth & Characterization of Epitaxial Cubic Boron Nitride Films on Silicon" Submitted to Phy. Rev. Lett Oct. 25, 1990.

Paul et al "Laser Assited Deposition of BN Films on InP for MIS Application" *Electronics Letters*, 9th Nov. 1989, vol. 25, No. 23 pp. 1602-1603.

"Laser Pulse Vapour Deposition of Polycrystalline Wurtzite-type BN", Thin Solid Films, 147 (1987) L45-L50.

"Growth of Stoichiometric BN Films by Pulsed Laser Evaporation", Mat. Res. Soc. Symp. Proc., vol. 128 (1989) pp. 469-474.

Chemical Abstract 110(22): 197972n.

Rother et al, "Preparation & Characterization of Ion Plated Boron Nitride", Thin Solid Films, vol. 142, pp. 83-99 (1986).

Weismantel et al, "Preparation and Properties of Hard i-C and i-BN Coatings", Thin Solid Films, vol. 98, pp. 31-44 (1982).

Thin Solid Films, vol. 153, No. 1, 26th Oct. 1987, pp. 487-496; P. Lin et al.: "Preparation and properties of cubic boron nitride coatings" *Abstract*.

A. R. Badzian, "Cubic Boron Nitride—Diamond Mixed Crystals", *Mat. Res. Bull.*, vol. 16, pp. 1385-1393, (1981).

G. Kessler et al, "Laser Pulse Vapour Deposition of Polycrystalline Wurtzite-type BN", *Thin Solid Films*, vol. 147, pp. L45-L50 (1987).

P. T. Murray et al, "Growth of Stoichiometric BN Films by Pulsed Laser Evaporation", *Mat. Res. Soc. Cymp. Proc.*, vol. 128, pp. 469-474 (1989).

G. L. Doll et al, "X-ray Diffraction Study of Cubic Boron Nitride Films Grown Epitaxially on Silicon", Mat. Res. Soc., Boston, Mass. (1990).

E. G. Bauer et al. Mat. Res. 5, 852 (1990).

(List continued on next page.)

*Primary Examiner*—A. A. Turner
*Attorney, Agent, or Firm*—Cary W. Brooks

[57] ABSTRACT

Thin films of boron nitride are grown on single crystal silicon substrates using laser deposition techniques. The films are characterized by essentially a single crystal throughout and having a cubic structure which is in epitaxial registry with the underlying silicon substrate.

3 Claims, 1 Drawing Sheet

OTHER PUBLICATIONS

S. Koizumi et al, Appl. Phys. Lett. 57, 563 (1990).
S. P. S. Arya et al, Thin Solid Films 157, 267 (1988).
H. Sankur et al, Appl. Phys. A 47, 271 (1988).
B. E. Williams et al, J. Mat. Res. 4, 373 (1989).
J. S. Speck et al, J. Mat. Res. 5, 980 (1990).
S. V. Gaponov et al, Sov. Tech. Phys. 27, 1130 (1982).
S. J. Thomas et al, Appl. Phys. Lett. 40, 200 (1982).
J. E. Rothenberg et al, Nucl. Instr. and Meth. B1, 291 (1984).
B. D. Cullity, "Elements of X-ray Diffraction" 2nd Edition, (Addison-Wesley, Reading, Mass., 1978), p. 142.
R. N. Sheftal et al, Crys. Res.Tech. 16, 887 (1981).
G. L. Doll et al, "Effects of Excimer Laser Ablation on the Surfaces of Hexagonal Boron Nitride Targets", Mat. Res. Soc., Boston, Mass. (1990).
D. Dijkkamp et al, Appl. Phys. Lett. 51, 619 (1987).
Q. Y. Ying et al, Appl. Phys. Lett. 55, 1041 (1989).
J. T. Cheung et al, CRC Critical Reviews in Solid State and Materials Sciences 15, 63 (1988).
J. P. Rebouillat et al, Proceedings of the Materials Research Society vol. 151, 259 (1989).
H. Schwartz et al, J. Vac. Sci. Techn. 6, 373 (1969).
S. G. Hansen et al, Appl. Phys. Lett. 52, 81 (1988).
R. J. Nemanich et al, Phys. Rev. B 23, 6348 (1981).

LASER DEPOSITON OF CRYSTALLINE BORON NITRIDE FILMS

This is a division of application Ser. No. 07/446,758 filed on Dec. 6, 1989, now abandoned.

This invention relates to the formation of thin films of boron nitride. In particular, this invention relates to a method for forming thin films of single crystal, Cubic phase boron nitride epitaxially oriented upon a silicon substrate using laser ablation techniques.

BACKGROUND OF THE INVENTION

Boron nitride (BN) is a most interesting III-IV compound from both the practical and scientific viewpoints. Boron nitride is characterized by three different crystal structures: hexagonal (hBN), wurtzite (wBN) and cubic zincblende (zBN). It is interesting that the physical properties of the boron nitride phase characterized by the cubic zincblende crystal structure are comparable to diamond in that the cubic zincblende boron nitride and diamond have low densities, extremely high thermal conductivities, and large resistivities. In addition, the cubic zincblende boron nitride and diamond have similar tribological properties and are relatively inert chemically.

There has been much research directed toward the growth of diamond thin films for various purposes. Therefore significant effort has also been directed to growing these cubic zincblende boron nitride films for the same purposes. This is not only because of the similarities between the two materials in their electrical, thermal and tribological properties, but because the cubic zincblende boron nitride may also prove to be an attractive substrate for subsequent diamond growth due to the small mismatch in crystal lattice constants. As with the diamond films, previous attempts at depositing cubic boron nitride films have failed to produce the desired homogeneous, single-crystal, and epitaxially oriented films.

Pulsed laser deposition of thin-films has recently been demonstrated to be a useful technique for preparation of thin films of a wide variety of materials including polymers, semiconductors, superconductors, and nonlinear dielectrics. Typically, when utilizing laser deposition techniques, a substrate of appropriate material is maintained at an elevated temperature opposite to a target having a composition the same or similar to the desired thin film. A focused pulsed laser beam, usually from an excimer laser source, is incident on the target at an angle of approximately 45°. The deposition is generally performed in a vacuum or other appropriate atmosphere such as flowing oxygen in the case of the copper oxide superconductors.

Advantages of the laser deposition method over other deposition techniques, such as evaporation, include a faster deposition rate, the requirement for only a single target, and the ability to deposit materials possessing high boiling point temperatures, such as refractory materials. Advantages over sputtering deposition methods also include the requirement of only a single target, as well as the preservation of material composition from the target to the film. It is therefore advantageous to use laser deposition techniques for the formation of thin films of materials. In particular it would appear to be advantageous to use these laser deposition methods for the formation of thin films of materials such as boron nitride.

In summary, it is desirable to provide cubic boron nitride thin films, and particularly, to provide a method for forming these thin films, wherein the resulting thin films of cubic boron nitride are essentially single-crystal, homogeneous and epitaxially oriented with the underlying substrate.

SUMMARY OF THE INVENTION

It is an object of the present invention to provide thin films of boron nitride.

It is a further object of this invention to provide a method for forming these thin films of boron nitride using laser deposition techniques.

Lastly, it is still a further object of this invention that these thin films of boron nitride be characterized by a homogeneous single crystal, cubic structure, which is epitaxially aligned with an underlying substrate.

In accordance with a preferred embodiment of this invention, these and other objects and advantages are accomplished as follows.

We are the first to grow thin films of boron nitride on single-crystal silicon substrates using laser deposition techniques, wherein the films are characterized by being essentially single-crystal and having a cubic structure which is in registry with the underlying silicon substrate.

This was accomplished by first providing a single-crystal silicon substrate oriented throughout along its [100] crystallographic axis. A boron nitride target containing polycrystalline, hexagonally oriented, pyrolitic boron nitride was located opposite from the single-crystal silicon substrate within a stainless steel 6-way cross chamber which was evacuated to a pressure of about about $3 \times 10^{-4}$ Torr. The n-type single crystal silicon substrate was heated to approximately 400° C. and maintained there during deposition. A KrF excimer laser operating at approximately 248 nanometers and approximately 10 pulses per second was used as the ablating beam. The laser ablation of the boron nitride target was conducted in ultra high purity nitrogen gas, and at various laser fluences ranging from about 1.5 to 5.2 $J/cm^2$.

The deposited, boron nitride films were examined using characterization probes of transmission electron microscopy, scanning electron miscroscopy, optical microscopy, and electron probe microanalysis. The boron nitride films were determined to be essentially characterized by a single-crystal, cubic structure which is in registry with the underlying silicon substrate.

Other objects and advantages of this invention will be better appreciated from the detailed description thereof, which follows.

BRIEF DESCRIPTION OF THE DRAWINGS

The above and other advantages of this invention will become more apparent from the following description taken in conjunction with the accompanying drawing wherein.

DESCRIPTION OF THE PREFERRED EMBODIMENTS

We are the first to provide a method for growing thin films of single crystal, cubic boron nitride, which are epitaxially oriented upon an underlying silicon substrate.

Figure 1:
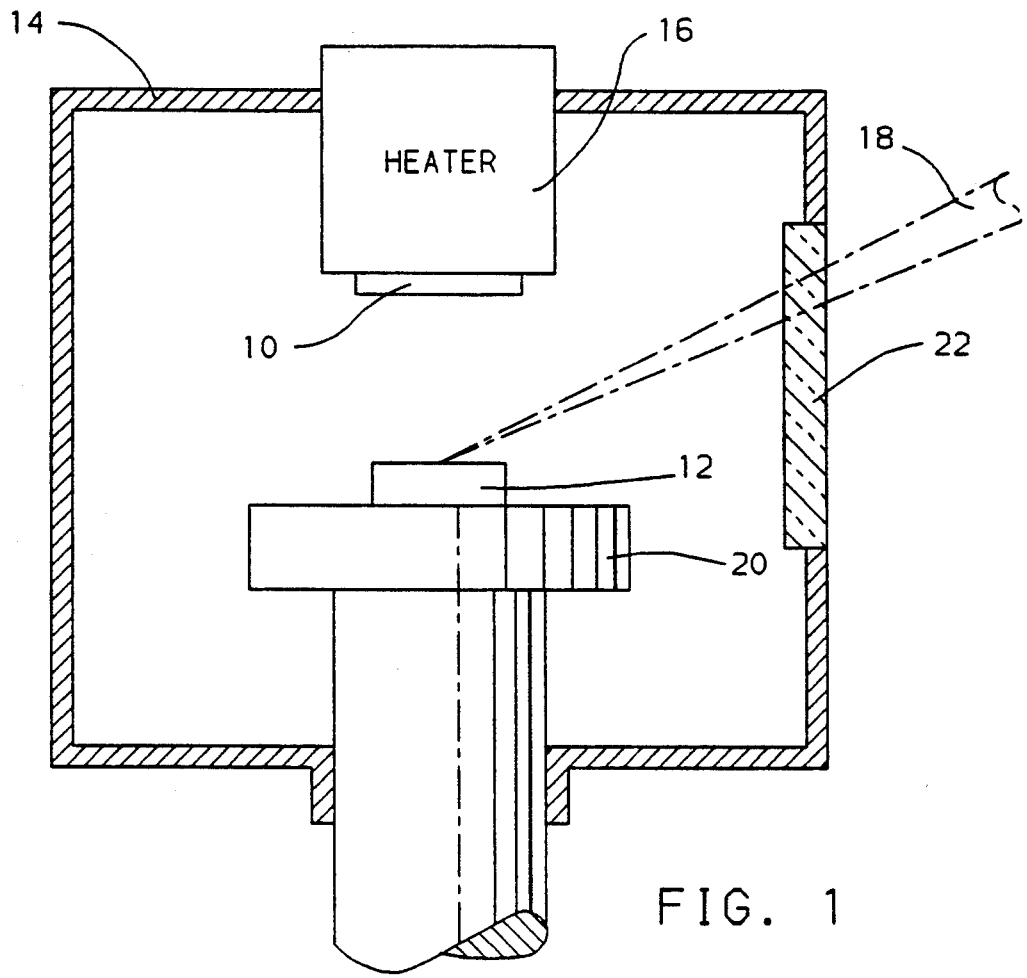
FIG. 1 schematically illustrates the preferred laser ablation setup in accordance with this invention for formation of thin films of single crystal, cubic boron nitride epitaxially oriented upon a silicon substrate.

As shown schematically in accompanying FIG. 1, a single-crystal silicon substrate 10 oriented throughout along its [1001] crystallographic axis is provided. A boron nitride target 12 containing polycrystalline, hexagonally oriented, pyrolitic boron nitride was provided on a rotating turntable 20 and located about 4 cm from the single-crystal silicon substrate 10 within a stainless steel 6-way cross chamber 14 which was evacuated to a pressure of about about $3 \times 10^{-4}$ Torr. The n-type single crystal silicon substrate 10 was heated by a heater 16 to approximately 400° C. and maintained there during the ablation and deposition process. The films produced at 400° C. exhibited the desired cubic, epitaxially oriented boron nitride, however there was some signs of oxygen impurities. Films have also been formed by heating the substrate to 675° C. during ablation and deposition. These films exhibit significantly less impurities, however the desired cubic structure has not been confirmed. A KrF excimer laser source (the laser beam depicted as 18) operating at a wavelength of approximately 248 nanometers and a frequency of approximately 10 pulses per second was used as the ablating beam. The laser beam 18 emitted from the excimer laser source outside the chamber 14, passed through a transparent window 22 prior to incidence upon the target 12. The depositions were conducted in ultra high purity nitrogen gas and at various laser fluences ranging from about 1.5 to 5.2 $J/cm^2$.

More specifically, prior to the laser deposition, a polished n-type, single crystal, silicon wafer oriented along its [100] crystallographic axis was provided. The wafer had a thin naturally occurring oxide layer on its surface believed to be on the order of several tens of Angstroms thick. The wafer was cut into approximately 1 square centimeter pieces, ultrasonically cleaned and fastened to a substrate holder. The silicon substrate was attached to the heater within the chamber and heated to approximately 400° C. This temperature was maintained during the deposition.

The laser depositions were performed in a stainless steel 6-way cross chamber which was evacuated by a turbomolecular pump to approximately $3 \times 10^{-4}$ Torr pressure. The target, a piece of polycrystalline, highly oriented, hexagonal boron nitride commercially available from Union Carbide, was rotated during the laser ablation to prevent excessive cratering within the target from the laser/target interaction. Unoriented, hexagonal BN target (Union Carbide commercial grades HBC or HBR) may also be used. A KrF excimer laser operating at a wavelength of approximately 248 nanometers and a frequency of approximately 10 pulses per second, was used as the ablating beam. The target to substrate separation was approximately 4 centimeters, but may vary between about 2.5 centimeters and greater than 4 centimeters depending upon the operating parameters of the laser.

The laser ablations of the boron nitride target were conducted within the evacuated chamber in the presence of ultra high purity, i.e., approximately 99.99995%, nitrogen gas flowing at 10 sccm. For the present chamber geometry, this resulted in an ambient pressure of approximately 45 mTorr at the deposition surface of the silicon substrate. The presence of the nitrogen gas served to limit the size of the plasma plume generated by the interaction between the laser and the target, and to make the nitrogen concentration of the films nearly stoichiometric with the boron. We have also deposited using our method in $NH_3$ gas to try to increase the nitrogen content. We believe the films are also cubic, epitaxial boron nitride. After the deposition of the boron nitride onto the silicon substrate, the film and substrate were cooled in flowing nitrogen to room temperature.

The laser depositions of boron nitride were conducted at various laser fluences ranging from approximately 1.5 to 5.2 $J/cm^2$. In a separate experiment, the minimum threshold fluence for ablation of the hexagonal boron nitride target was determined to be approximately 0.31 to 0.34 $J/cm^2$. Therefore, the laser depositions occurred at fluences significantly greater than the minimum threshold required.

The thickness of the boron nitride thin films as determined by stylus profilometry, were found to vary linearly with laser fluence. The thickness was also found to be linearly dependent on the number of laser pulses. At a laser fluence of approximately 3.9 $J/cm^2$, an average deposition rate of approximately 0.182 Angstroms per pulse was measured. For a 12,000 pulse run and a laser fluence of approximately 1.5 $J/cm^2$, a film was produced having a thickness of approximately 176 nanometers.

In the films deposited in accordance with this invention, it was observed that the boron nitride/silicon interface had a blue appearance. This indicates that the films form an antireflective coating absorbing in the yellow-green region of the visible spectrum. The film thickness (d), index of refraction (n), and absorbed wavelength (λ) are related to each other for antireflective coatings, through the equation $$nd = (m - \tfrac{1}{2}) \times (\lambda/2)$$

where m is the interference order integer. For λ equal to 550 nanometers (yellow-green light), and a film thickness, d, equal to approximately 176 nanometers, we find that n is equal to $(m - \tfrac{1}{2}) \times 1.56$. Clearly m equal to 1 is not the interference order since n can never be less than unity. However, with m equal to 2, n is equal to approximately 2.34, which is consistent with that of cubic boron nitride at 2.1 and that of diamond at 2.42.

The film morphology was investigated with optical and scanning electron microscopies. To the resolution limit of the scanning electron microscopy instrument, approximately 100 Angstroms, no evidence of grain boundaries was observed. This implies that either the film is a single crystal, or that the film is amorphous possessing little or no crystallinity. The latter hypothesis was excluded as a result of our subsequent transmission electron microscopy research. The optical microscope provided evidence that the film was of uniform thickness and nearly transparent. Micron sized particulates of undetermined origin were also observed to be sparsely distributed across the film surface, however, it is believed that these particulates can be eliminated with further development and testing of the operating parameters.

The relative atomic composition of the boron nitride thin films prepared in accordance with this invention were determined with electron probe microanalysis employing the ZAF analytical technique. It was found that the resulting film is slightly nonstoichiometric with approximately 57% boron and 4.1% nitrogen, and with a plus or minus 10% relative error. In addition, trace impurities of carbon and oxygen, less than approximately 1% each were observed.

The combination of low X-ray scattering intensities for boron nitride and a 176 cm film thickness makes characterization using conventional X-ray diffraction difficult. However, initial patterns on the resulting thin films of boron nitride showed indications of a crystalline cubic phase. This finding was confirmed through transmission electron microscopy, which is especially well suited to the aforementioned problems. It was determined that the resulting thin films were characterized by a cubic structure. It is believed that the impingement of the laser on the hexagonally oriented boron nitride target results in dissociation of the boron nitride compound, thereby permitting the vaporized boron and nitrogen atoms to deposit on and align themselves with the cubic silicon substrate.

In order to use transmission electron microscopy, the substrates had to be slowly etched in order to obtain boron nitride films having a thickness of approximately 50 to 100 Angstroms. A dilute acid etch comprising hydrofluoric acid and nitric acid in water was used to reduce the thickness of the silicon to less than 1 micron. The boron nitride/silicon substrate was then ion-milled thereby producing regions of extremely thin boron nitride.

The transmission electron microscopy diffraction pattern of a representative region showed a diffraction pattern of a cubic crystal with a lattice constant of approximately 3.8 Angstroms. However the accepted lattice constant of cubic zincblende boron nitride powder is approximately 3.6 Angstroms. Thus the thin film lattice for the cubic boron nitride formed in accordance with this invention is expanded by about 5% from the accepted cubic zincblende boron nitride powder lattice. The 3.8 Angstrom lattice constant of our boron nitride film closely resembles a dense, cubic form of boron nitride called "shock-wave compressed".

Figure 2:
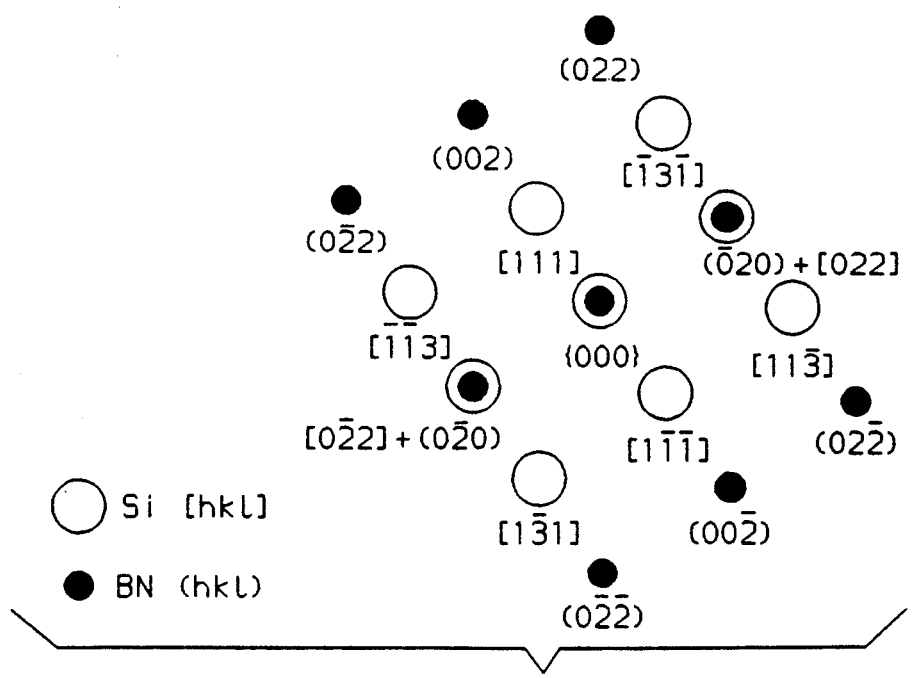
FIG. 2 is the transmission electron microscopy diffraction pattern for a representative sample of the thin films of single crystal, cubic boron nitride formed in accordance with the setup of FIG. 1.

As shown in FIG. 2, the transmission electron microscopy diffraction patterns for the resulting cubic boron nitride films formed upon the silicon substrate contain a superposition of a [211] plane of silicon and a (100) plane of cubic boron nitride. This diffraction pattern shows that the [022] direction of silicon is parallel to the (020) direction of the cubic boron nitride films, and that the [111] direction of silicon is almost parallel to the (002) direction of cubic boron nitride. Therefore, there is a preferred orientation for the cubic boron nitride films with respect to the underlying silicon substrate, with the (020) direction of cubic boron nitride parallel to the [022] direction of silicon. This is considered to be substantial evidence that the cubic boron nitride film is epitaxially aligned with the silicon substrate.

The 3.8 Angstrom lattice constant of the cubic boron nitride film is particularly well suited to the silicon substrate. Since silicon has a diamond-like crystallographic structure with a lattice constant of approximately 5.42 Angstroms, two cubic boron nitride lattice constants can fit across the [100] diagonal of the silicon lattice, i.e., 3.8 Angstroms equals 5.42 Angstoms divided by $2^{\frac{1}{2}}$. In this configuration, either the boron or the nitrogen atoms will reside over the silicon atoms.

We have also deposited using this method boron nitride on single crystal silicon substrates oriented along the [110] crystallographic plane and believe that the transmission electron microscopy results will show cubic, epitaxial boron nitride. We have deposited on single crystal silicon oriented along the [111] plane and this results in hexagonally oriented boron nitride. Cubic, epitaxially aligned silicon has also been obtained by our methods using 193 nanometer radiation from an ArF excimer laser at the same fluences described above, but at a photon energy of about 6.2 electron volts.

In general, for every known and potential application considered for diamond films, cubic boron nitride may be an appropriate substitute. Since cubic boron nitride is an excellent insulator which can be grown epitaxially on silicon and presumably has a high thermal conductivity similar to the cubic zincblende boron nitride, cubic boron nitride will have numerous uses as an insulating, thermally conductive barrier layer for silicon-based microelectronic devices. Further, the cubic boron nitride should be appropriate for many wear resistant applications, since the cubic zincblende boron nitride is second in hardness only to diamond.

This invention readily provides a method for forming single-crystal, epitaxially aligned thin films of cubic boron nitride on single-crystal silicon substrates. While our invention has been described in terms of preferred embodiments, it is apparent that other forms of the device could be adopted by one skilled in the art, such as by substituting materials or processing components, as well as by varying the processing parameters. Accordingly the scope of our invention is to be limited only by the following claims.

The embodiments of the invention in which an exclusive property or privilege is claimed are defined as follows:

1. A thin film of boron nitride wherein a thin film of boron nitride is deposited onto a silicon substrate oriented essentially along its crystallographic plane and wherein said thin film of boron nitride is characterized by essentially a cubic single crystal structure and crystallographically oriented with said silicon substrate.

2. A thin film of boron nitride as recited in claim 1 wherein the lattice constant of said cubic single crystal boron nitride film ranges between about 3.6 and 3.8 Angstroms.

3. A thin film of boron nitride as recited in claim 1 wherein the lattice constant of said cubic single crystal boron nitride film is approximately 3.8 Angstroms.

* * * * *